United States Patent [19]

Rakers et al.

[11] Patent Number: 5,572,154

[45] Date of Patent: Nov. 5, 1996

[54] CIRCUIT AND METHOD OF SAMPLING AN ANALOG SIGNAL

[75] Inventors: Patrick L. Rakers, Schaumburg; Christopher P. Lash, Arlington Heights; Steven F. Gillig, Roselle, all of Ill.

[73] Assignee: Motorola, Inc., Schaumburg, Ill.

[21] Appl. No.: 498,716

[22] Filed: Jul. 3, 1995

[51] Int. Cl.$^6$ .......................... G11C 27/02; H03K 17/76
[52] U.S. Cl. ................... 327/92; 327/91; 327/94; 327/95; 327/96; 327/494
[58] Field of Search .................. 327/91, 94, 92, 327/93, 50, 303, 95, 96, 45, 554, 336, 337, 494

[56] References Cited

U.S. PATENT DOCUMENTS 5,187,390  2/1993  Scott, III ................... 327/379
5,281,867  1/1994  Camphbell et al. ................. 327/91

FOREIGN PATENT DOCUMENTS 5012897  1/1993  Japan ................... 327/94

*Primary Examiner*—Timothy P. Callahan
*Assistant Examiner*—Dinh T. Le
*Attorney, Agent, or Firm*—Robert D. Atkins; Jeffrey D. Nehr

[57] ABSTRACT

A sample circuit (10) maintains linear operation over frequency. A switchable diode bridge (12) passes the analog input signal when enabled to one terminal of a sample storage capacitor (14). The second terminal of the capacitor is coupled through a closed FET switch (16) to a reference node (18). Once the analog input signal is stored across the capacitor, the FET switch opens before the diode bridge disables. When the second terminal of the capacitor floats and prevents any further charge from altering the sample voltage across the capacitor. When the diode bridge is disabled, the sample voltage across the capacitor does not change. The sample voltage may be amplified and digitized for further processing in the cellular system.

14 Claims, 2 Drawing Sheets

5,572,154

1

CIRCUIT AND METHOD OF SAMPLING AN ANALOG SIGNAL

BACKGROUND OF THE INVENTION

The present invention relates in general to integrated circuits and, more particularly, to a sampling circuit that stores an analog input signal across a storage element and then isolates the storage element to avoid injecting errors into the sample.

Many communication systems sample an analog signal and convert it to a digital form which is generally easier to work with in further processing. The sample should be a precise replica of the analog signal in order to get an accurate digital representation. Any error between the sample and the actual analog signal should be as small as possible and highly linear over the operating range of the analog signal. High frequency analog signals tend to have larger errors than low frequency signals because of uncertainty in the exact time of sampling. High frequency signals change more rapidly and have a greater uncertainty in the sample point.

In the prior art sample circuits, the analog signal is applied to one side of a four-diode bridge circuit. A sampling capacitor is connected between the opposite side of the diode bridge and ground potential. The diode bridge is enabled and disabled with current sources. When the current sources are enabled, the analog signal passes through the diode bridge and develops a charge across the capacitor. The current sources are made sufficiently large to make the forward diode voltages of the bridge independent of the analog signal. The sampling linearity improves over frequency with high bias currents from the current sources relative to the analog signal, i.e. high bias current to analog signal ratio. To sample the analog signal, the current sources are turned off to disable the diode bridge which blocks the analog signal and captures the present capacitor voltage.

An error in the sample voltage across the capacitor arises as the current sources turn-off to disable the diode bridge. As the bias current to analog signal ratio becomes small, and eventually inverts to reverse bias the diode bridge, the sample voltage becomes in part a non-linear function of the input voltage. The sampling linearity decreases and errors accumulate on the capacitor during the turn-off time of the current sources. It is not practical to turn the current sources off fast enough to avoid the non-linear effects and error problems.

Another source of error in the sampling process is the inherent non-linear capacitances across the diodes on the capacitor side of the bridge after the current sources are disabled. A capacitor divider forms between the sampling capacitor and the inherent capacitances across the diodes. The capacitor divider forces charge injection from the diode capacitance into the sampling capacitor thereby altering the stored charge and introducing an error in the sample. Since the diode capacitances are non-linear, the charge injection introduces different errors across the sampling capacitor over frequency and signal level.

Hence, a need exists to sample an analog signal and maintain a linear sampling over a wide frequency range.

2

Figure 1:
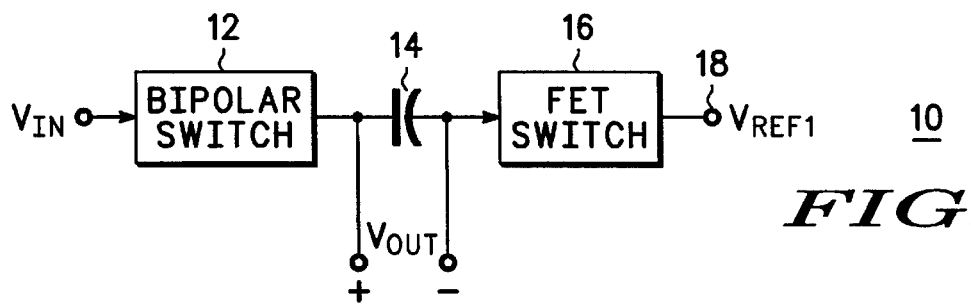
FIG. 1 is a block diagram illustrating a sample circuit with a FET isolation switch.
Figure 2:
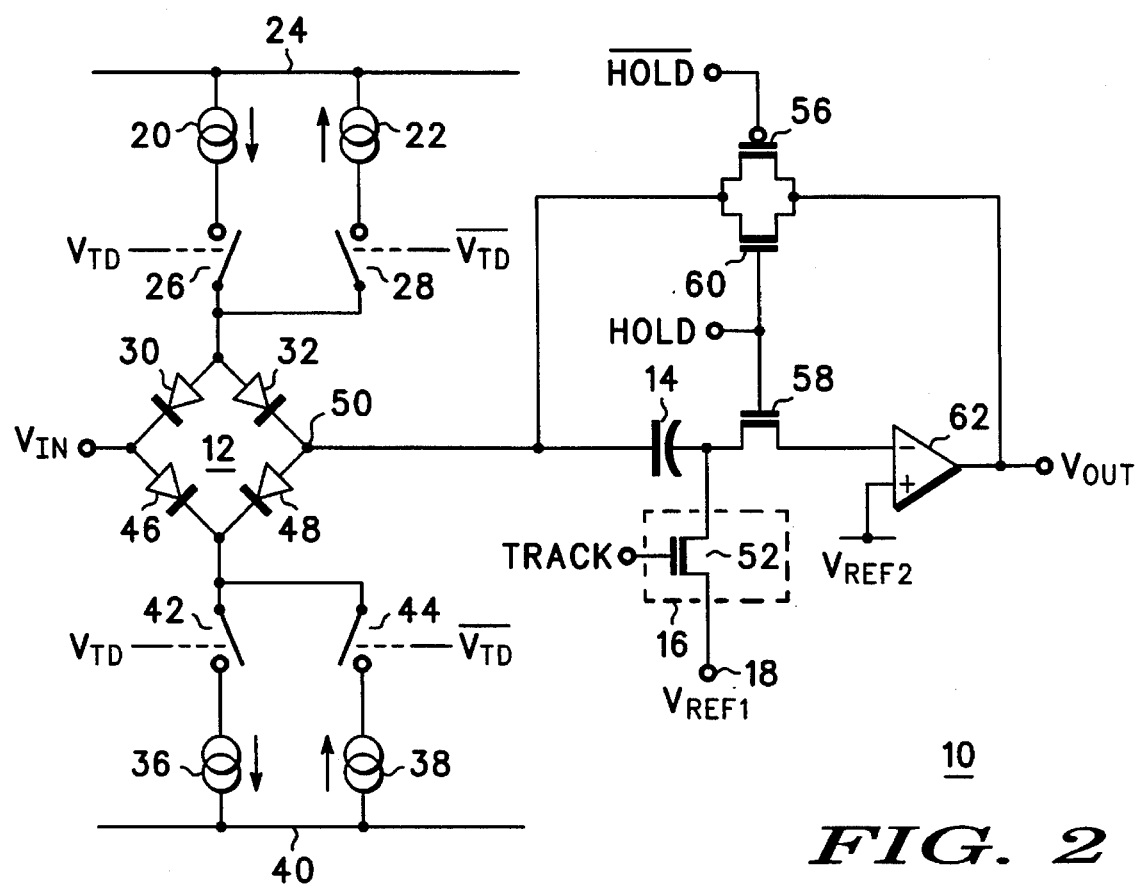
Figure 3:
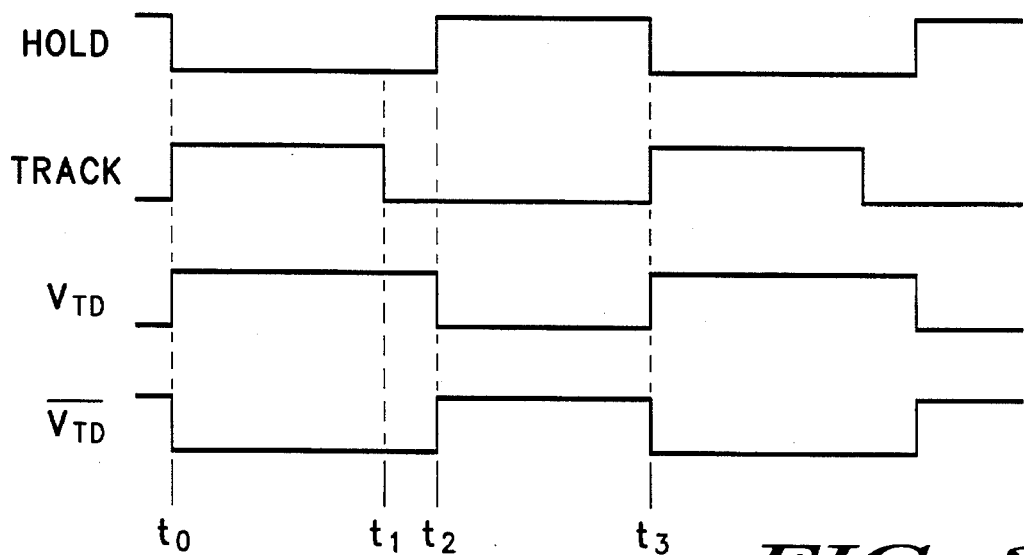

FIG. 2 is a schematic diagram illustrating further detail the sample and hold circuit of FIG. 1;

FIG. 3 is a waveform plot useful in explaining the present invention; and

Figure 4:
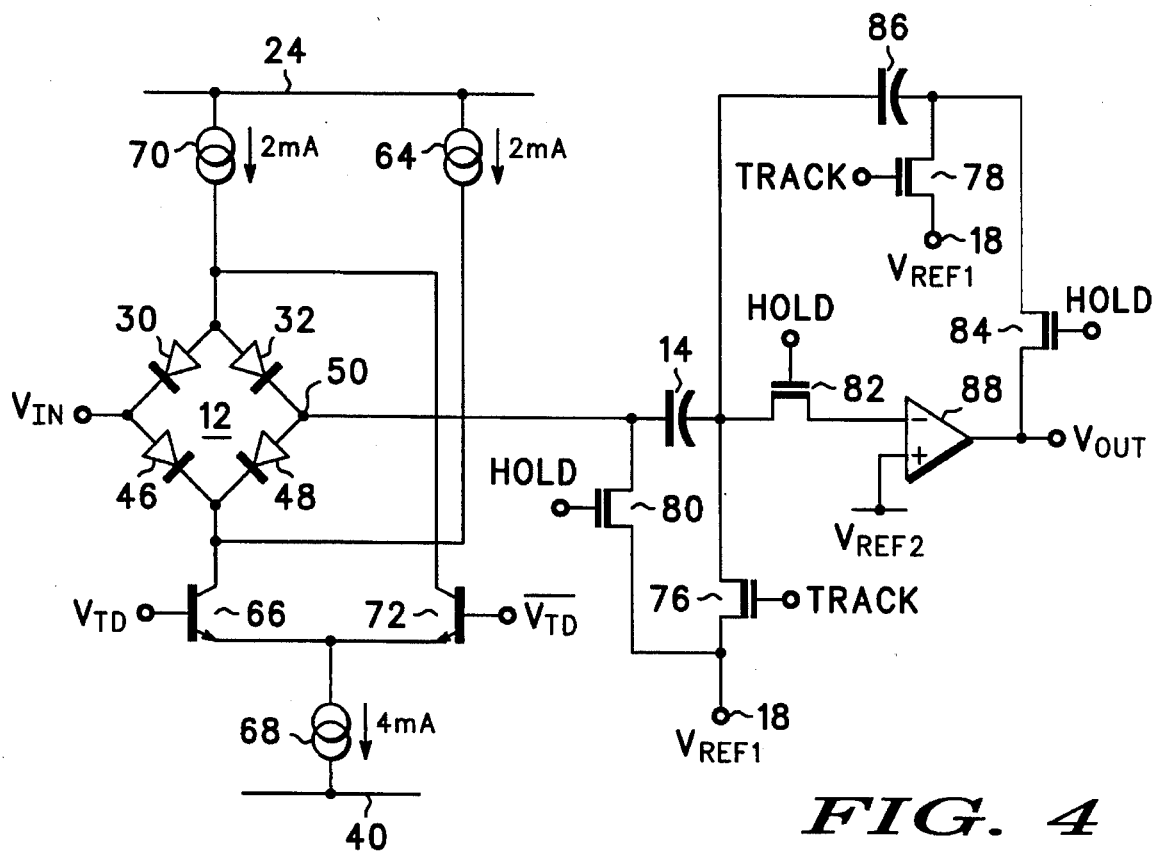

FIG. 4 is an alternate embodiment of the sample and hold circuit with a FET isolation switch.

DETAILED DESCRIPTION OF THE PREFERRED EMBODIMENT

A sample circuit 10 is shown in FIG. 1 for sampling an analog input signal $V_{IN}$. The analog signal $V_{IN}$ is 1.0 volts peak-to-peak and can range from DC up to high frequencies on the order of 90.0 MHz. Sampling circuit 10 is applicable to wide-band receivers in a cellular system. For example, an entire cellular band can be sampled and digitized so that the individual frequencies within the wide band are digitally selectable.

Bipolar switching circuit 12 when enabled passes the analog signal $V_{IN}$ to node 50 for storage across sampling capacitor 14. FET switch 16 is coupled between capacitor 14 and node 18 operating at reference potential $V_{REF1}$. The reference potential $V_{REF1}$ is set to an analog ground of 1.0 volts. FET switch 16 is enabled during the enable time of switching circuit 12 to allow the analog input signal $V_{IN}$ to be stored across capacitor 14. FET switch 16 is opened before switching circuit 12 is disabled to float one terminal of capacitor 14 and prevent non-linearities in switching circuit 12 from altering the sample charge stored across capacitor 14. Once switching circuit 12 is disabled, the sampled voltage stored across capacitor 14 is read as output signal $V_{OUT}$.

Further detail of sample circuit 10 is shown in FIG. 2. Bipolar switching circuit 12 is implemented as a diode bridge that includes current sources 20 and 22 referenced to power supply conductor 24 operating at 5.0 volts. Current sources 20 and 22 are coupled by way of switching circuits 26 and 28, respectively, to the anodes of diodes 30 and 32. Current sources 36 and 38 are referenced to power supply conductor 40 operating at ground potential and coupled by way of switching circuits 42 and 44, respectively, to the cathodes of diodes 46 and 48. Switching circuits 26 and 42 operate in response to control signal $V_{TD}$, while switching circuits 28 and 44 operate in response to control signal $\overline{V_{TD}}$. Diodes 30, 32, 46, and 48 are implemented with bipolar transistors having their base and collector shorted together. Switching circuits 26, 28, 42, and 44 are implemented with bipolar transistors with the base terminals receiving the control signals. Current sources 20, 22, 36, and 38 are implemented with MOS transistors receiving a fixed reference potential at their gates.

As part of the present invention, the interconnection of diodes 32 and 48 at node 50 is coupled to a first terminal of sampling capacitor 14. The second terminal of capacitor 14 is coupled to the drain of transistor 52 operating as FET switch 16. The gate of transistor 52 receives a control signal TRACK, while its source is coupled to node 18 for receiving the reference potential $V_{REF1}$. With the source of transistor 52 coupled to a fixed reference potential, its gate-source voltage ($V_{GS}$) is constant when TRACK is high, e.g. 5.0 volts. The constant $V_{GS}$ maintains a fixed impedance for FET switch 16 independent of the amplitude and frequency of the analog input signal $V_{IN}$.

The operation of sampling circuit 10 proceeds as follows. At time $t_0$ in FIG. 3, control signal $V_{TD}$ goes to logic one and control signal $\overline{V_{TD}}$ goes to logic zero. Switching circuits 26 and 42 close in response to the logic one $V_{TD}$ and switching circuits 28 and 44 open in response to the logic zero $\overline{V_{TD}}$. Control signal $\overline{V_{TD}}$ is non-overlapping and inverted with respect to $V_{TD}$. A conduction path is established from current source 20 through diodes 30 and 32 and diodes 46 and 48 to current source 36. Diodes 30, 32, 46 and 48 become forward biased and the diode bridge is enabled to operate as a bipolar switch so that node 50 tracks the analog input signal $V_{IN}$. As long as the forward bias voltages across diodes 30 and 32 match, and the forward bias voltages across diodes 46 and 48 match, then node 50 follows the analog input signal $V_{IN}$.

Also at time $t_0$ in FIG. 3, control signal TRACK goes high to turn on transistor 52. Control signal HOLD is logic zero which turns off transistors 58 and 60, and control signal $\overline{HOLD}$ (inverted HOLD) is logic one which turns off transistor 56 to isolate capacitor 14 from amplifier 62. With transistor 52 conducting, a conduction path is established such that a signal current from $V_{IN}$ can flow through the diode bridge and capacitor 14 through transistor 52 to node 18 whereby capacitor 14 charges up to the signal voltage from $V_{IN}$. Thus, sampling capacitor 14 operates as a charge storage element that develops a sample voltage $V_{SAMPLE}$ equal to the analog input signal $V_{IN}$. Current sources 20 and 36 provide bias currents, say 4.5 milliamps (ma), that are much larger than the current flow from $V_{IN}$ so that the forward diode voltages of the bridge operate independent of the analog input signal. The sampling process is substantially linear over frequency with high bias current from current sources 20 and 36 relative to the analog signal, i.e. high bias current to analog signal ratio. The fixed impedance of FET switch 16 independent of $V_{IN}$ also maintains linear sampling over frequency.

By time $t_1$ of FIG. 3, capacitor 14 is fully charged to the $V_{SAMPLE}$ value equal to the analog input signal $V_{IN}$. The sample value stored across capacitor 14 tracks linearly with $V_{IN}$ over frequency as noted above. At time $t_1$, control signal TRACK goes to logic zero to turn off transistor 52 before control signal $V_{TD}$ goes to logic zero to disable the diode bridge. The logic zero TRACK open-circuits the conduction path from the diode bridge through capacitor 14 and transistor 52. The second terminal of capacitor 14 coupled to transistor 52 is now floating and isolated from node 18. With the open FET switch circuit 16, no more charge can be coupled onto capacitor 14 because no signal current $V_{IN}$ can flow from the diode bridge through the sampling capacitor.

At time $t_2$ of FIG. 3, control signal $V_{TD}$ goes to logic zero and control signal $\overline{V_{TD}}$ goes to logic one in a non-overlapping manner. Again, it is important that control signals $V_{TD}$ and $\overline{V_{TD}}$ change state to disable the diode bridge after control signal TRACK has opened FET switch 16. Switching circuits 26 and 42 open in response to the logic zero $V_{TD}$ and switching circuits 28 and 44 close in response to the logic one $\overline{V_{TD}}$. The conduction path from current source 20 through diodes 30 and 32 and diodes 46 and 48 to current source 36 is opened. Current sources 22 and 38 conduct current so as to reverse bias diodes 30, 32, 46 and 48 and disable the diode bridge. The problems noted in the background of non-linear effects while turning off the current sources and the charge injection from the capacitor divider with the inherent diode capacitors are no longer applicable because the second terminal of capacitor 14 is floating. Even though the voltage at node 50 may change because of these undesirable errors, no charge current can flow from node 50 into capacitor 14 and alter its charge because the opening of FET switch 16 has made its second terminal high impedance. Thus, the sample voltage $V_{SAMPLE}$ across capacitor 14 does not significantly change when the diode bridge is disabled.

Once the diode bridge is disabled, capacitor 14 is completely isolated and has stored a charge that is linearly related to the analog input signal $V_{IN}$. When control signal $\overline{HOLD}$ goes to logic zero, transistor 56 turns on. The control signal HOLD goes to logic one after time $t_2$ to turn on transistors 58 and 60. Capacitor 14 is coupled between the inverting input of amplifier 62 and its output in an integrator configuration. The non-inverting input of amplifier 62 receives a reference potential $V_{REF2}$ operating at an analog ground such as 1.0 volts. Again, the sample voltage across capacitor 14 does not change because of the high input impedance of amplifier 62. The output voltage $V_{OUT}$ of amplifier 62 has 90 dB of linearity up to 90.0 MHz and equal to the sample voltage across capacitor 14 which is equal to the analog input signal $V_{IN}$. The output voltage $V_{OUT}$ may then be digitized for further processing in the cellular system.

An alternate embodiment of the sample and hold circuit is shown in FIG. 4. Components having a similar function are assigned the same reference numbers used in FIG. 2. The switchable diode bridge is modified to include a current steering circuit including current source 64 which sources a 2.0 ma current and is coupled to the collector of bipolar transistor 66 and to the cathodes of diodes 46 and 48. The base of transistor 66 receives control signal $V_{TD}$, and its emitter is coupled to current source 68 which sinks 4.0 ma. Current source 70 sources a 2.0 ma current and is coupled to the collector of bipolar transistor 72 and to the anodes of diodes 30 and 32. The base of transistor 72 receives control signal $\overline{V_{TD}}$, and the emitter of transistor 72 is coupled to current source 68. Current sources 64, 68, and 70 are implemented with MOS transistors receiving a fixed reference potential at their gates.

When control signal $V_{TD}$ is high at time $t_0$, transistor 66 conducts 2.0 ma from current source 64 and 2.0 ma from current source 70 through diodes 30, 32, 46, and 48 into current source 68. Control signal $\overline{V_{TD}}$ is low and transistor 72 is off. Diodes 30, 32, 46 and 48 become forward biased and the diode bridge is enabled so that node 50 tracks the analog input signal $V_{IN}$ whereby capacitor 14 charges up to a voltage equal to $V_{IN}$. Also at time $t_0$ in FIG. 3, control signal TRACK goes high to turn on transistors 76 and 78. Control signal HOLD is logic zero which turns off transistors 80, 82 and 84 to isolate capacitors 14 and 86 from amplifier 88. Capacitor 86 is charged to zero volts with transistors 76 and 78 conducting the same reference potential $V_{REF1}$ to both of its terminals.

With transistor 76 conducting, a conduction path is established such that a signal current from $V_{IN}$ can flow through the diode bridge and capacitor 14 through transistor 76 to node 18. Thus, sampling capacitor 14 operates as a charge storage element that develops a sample voltage $V_{SAMPLE}$ equal to the analog input signal $V_{IN}$.

By time $t_1$ of FIG. 3, capacitor 14 is fully charged to the $V_{SAMPLE}$ value equal to the analog input signal $V_{IN}$. The sample value stored across capacitor 14 tracks linearly with $V_{IN}$ over frequency as noted above. At time $t_1$, control signal TRACK goes low turning off transistors 76 and 78 before control signal $V_{TD}$ goes to logic zero to disable the diode bridge. The logic zero TRACK open-circuits the conduction path from the diode bridge through capacitor 14 and transistor 76. The second terminal of capacitor 14 coupled to transistor 76 is now floating and isolated from node 18. With the open FET switch circuit, no more charge can be coupled onto capacitor 14 because no signal current $V_{IN}$ can flow from the diode bridge through the sampling capacitor.

At time $t_2$ of FIG. 3, control signal $V_{TD}$ goes to logic zero and control signal $\overline{V_{TD}}$ goes to logic one in a non-overlapping manner. Again, it is important that control signals $V_{TD}$ and $\overline{V_{TD}}$ change state to disable the diode bridge after control signal TRACK has opened FET switches 76 and 78. Transistor 66 turns off in response to the logic zero $V_{TD}$ and transistor 72 turns on in response to the logic one $\overline{V_{TD}}$. The 2.0 ma from current source 64 flows up through diodes 30, 32, 46, and 48 and reverse biases their operation. Transistor 72 conducts the 2.0 ma flowing up through the diodes and the 2.0 ma from current source 70 to supply current source 68.

The problems noted in the background of non-linear effects while turning off the current sources and the charge injection from the capacitor divider with the inherent diode capacitors are no longer applicable because the second terminal of capacitor 14 is floating. Even though the voltage at node 50 may change because of these undesirable errors, no charge current can flow from node 50 into capacitor 14 and alter its charge because the opening of FET switches 76 and 78 has made its second terminal high impedance. Thus, the sample voltage $V_{SAMPLE}$ across capacitor does not significantly change when the diode bridge is disabled.

Once the diode bridge is disabled, capacitor 14 is completely isolated and has stored a charge that is linearly related to the analog input signal $V_{IN}$. The control signal HOLD goes to logic one after time $t_2$ to turn on transistors 80, 82, and 84. The reference potential $V_{REF1}$ is coupled through transistor 80 to node 50. The charged stored across capacitor 14 is thereby transferred to capacitor 86. Capacitor 86 is coupled between the inverting input of amplifier 88 and its output in an integrator configuration. The non-inverting input of amplifier 88 receives the reference potential $V_{REF2}$. The output voltage $V_{OUT}$ of amplifier 88 has 90 dB of linearity up to 90.0 MHz and equal to the sample voltage across capacitor 86 which is equal to the analog input signal $V_{IN}$. The output voltage $V_{OUT}$ may then be digitized for further processing in the cellular system.

The switchable diode bridge disclosed in FIG. 4 may be interchanged with the switchable diode bridge disclosed in FIG. 2. Likewise, the hold circuit disclosed in FIG. 2, e.g. transistors 56–60 and amplifier 62, may be interchanged with the hold circuit disclosed in FIG. 4, e.g. elements 80–88.

By now it should be appreciated that the present invention provides a sample circuit that maintains linear operation over frequency. A diode bridge passes the analog input signal when enabled to one terminal of a sample storage capacitor. The second terminal of the capacitor is coupled through a closed FET switch to a reference node. Once the analog input signal is stored across the capacitor, the FET switch opens before the diode bridge disables thereby breaking the conduction path from through the capacitor. The second terminal of the capacitor floats and prevents any further charge from altering the sample voltage across the capacitor. When the diode bridge is disabled, the sample voltage across the capacitor does not change and maintains linear operation over frequency.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A sampling circuit, comprising:

a bipolar switching circuit having an input coupled for receiving an analog input signal and having an output for passing said analog input signal to a first node in response to a first control signal;

a charge storage element having a first terminal coupled to said first node;

a first switching circuit operating in response to a second control signal and coupled between a second terminal of said charge storage element and a reference node at which a first reference potential is applied;

a first transistor having a drain coupled to said second terminal of said charge storage element, and a gate coupled for receiving a third control signal;

an amplifier having a first input coupled to a source of said first transistor, and a second input coupled for receiving a second reference potential; and a transmission gate having a first conduction terminal coupled to an output of said amplifier, a second conduction terminal coupled to said first terminal of said charge storage element, and a first control terminal coupled for receiving said third control signal.

2. The sampling circuit of claim 1 wherein said transmission gate includes:

a second transistor having a drain coupled to said first node, a source coupled to said output of said amplifier, and a gate coupled for receiving said third control signal; and a third transistor having a drain coupled to said first node, a source coupled to said output of said amplifier, and a gate coupled for receiving an inverted third control signal.

3. The sampling circuit of claim 2 wherein said first switching circuit includes a fourth transistor having a drain coupled to said second terminal of said charge storage element, a gate coupled for receiving said second control signal, and a source coupled to said reference node for receiving said first reference potential that maintains a constant gate-source voltage when said fourth transistor is conducting.

4. The sampling circuit of claim 3 wherein said charge storage element includes a first capacitor having a first terminal coupled to said first node and a second terminal coupled to said drain of said fourth transistor.

5. The sampling circuit of claim 4 wherein said bipolar switching circuit includes:

a first diode having a cathode coupled for receiving said analog input signal;

a second diode having an anode coupled to an anode of said first diode and having a cathode coupled to said first node;

a third diode having an anode coupled for receiving said analog input signal; and a fourth diode having a cathode coupled to a cathode of said third diode and having an anode coupled to said first node.

6. The sampling circuit of claim 5 wherein said bipolar switching circuit further includes:

a first current source having an output providing a first current;

a second switching circuit operating in response to said first control signal and coupled between said output of said first current source and said anodes of said first and second diodes;

a second current source having an output providing a second current;

a third switching circuit operating in response to an inverted first control signal and coupled between said output of said second current source and said anodes of said first and second diodes;

a third current source having an output providing a third current;

a fourth switching circuit operating in response to said first control signal and coupled between said output of said third current source and said cathodes of said third and fourth diodes;

a fourth current source having an output providing a fourth current; and a fifth switching circuit operating in response to said inverted first control signal and coupled between said output of said fourth current source and said cathodes of said third and fourth diodes.

7. The sampling circuit of claim 5 wherein said bipolar switching circuit further includes:

a first current source having an output providing a first current;

a second current source having an output coupled to said anodes of said first and second diodes for providing a second current;

a third current source having an output providing a third current;

a fifth transistor having a collector coupled to said cathodes of said third and fourth diodes and to said output of said first current source, a base coupled for receiving said first control signal, and an emitter coupled to said output of said third current source; and a sixth transistor having a collector coupled to said output of said second current source and to said anodes of said first and second diodes, a base coupled for receiving an inverted first control signal, and an emitter coupled to said output of said third current source.

8. A sampling circuit, comprising:

a bipolar switching circuit having an input coupled for receiving an analog input signal and having an output for passing said analog input signal to a first node in response to a first control signal;

a first charge storage element having a first terminal coupled to said first node;

a first switching circuit coupled between a second terminal of said first charge storage element and a reference node at which a first reference potential is applied, said first switching circuit being closed by a second control signal to store a sample signal across said first charge storage element when said bipolar switching circuit is enabled;

a first transistor having a drain coupled to said first node, a gate coupled for receiving a third control signal, and a source coupled for receiving said first reference potential;

a second charge storage element having a first terminal coupled to said second terminal of said first charge storage element; and a second transistor having a drain coupled to a second terminal of said second charge storage element, a source coupled for receiving said first reference potential, and a gate coupled for receiving said second control signal.

9. The sampling circuit of claim 8 further including:

a third transistor having a drain coupled to said second terminal of said first charge storage element, and a gate coupled for receiving said third control signal;

an amplifier having a first input coupled to a source of said third transistor, and a second input coupled for receiving a second reference potential; and a fourth transistor having a drain coupled to said second terminal of said second charge storage element, a source coupled to an output of said amplifier, and a gate coupled for receiving said third control signal.

10. The sampling circuit of claim 9 wherein said first switching circuit includes a fifth transistor having a drain coupled to said second terminal of said first charge storage element, a gate coupled for receiving said second control signal, and a source coupled to said reference node for receiving said first reference potential that maintains a constant gate-source voltage when said fifth transistor is conducting.

11. The sampling circuit of claim 10 wherein said first charge storage element includes a first capacitor having a first terminal coupled to said first node and a second terminal coupled to said drain of said fifth transistor.

12. The sampling circuit of claim 11 wherein said bipolar switching circuit includes:

a first diode having a cathode coupled for receiving said analog input signal;

a second diode having an anode coupled to an anode of said first diode and having a cathode coupled to said first node;

a third diode having an anode coupled for receiving said analog input signal; and a fourth diode having a cathode coupled to a cathode of said third diode and having an anode coupled to said first node.

13. The sampling circuit of claim 12 wherein said bipolar switching circuit further includes:

a first current source having an output providing a first current;

a second switching circuit operating in response to said first control signal and coupled between said output of said first current source and said anodes of said first and second diodes;

a second current source having an output providing a second current;

a third switching circuit operating in response to an inverted first control signal and coupled between said output of said second current source and said anodes of said first and second diodes;

a third current source having an output providing a third current;

a fourth switching circuit operating in response to said first control signal and coupled between said output of said third current source and said cathodes of said third and fourth diodes;

a fourth current source having an output providing a fourth current; and a fifth switching circuit operating in response to said inverted first control signal and coupled between said output of said fourth current source and said cathodes of said third and fourth diodes.

14. The sampling circuit of claim 12 wherein said bipolar switching circuit further includes:

a first current source having an output providing a first current;

a second current source having an output coupled to said anodes of said first and second diodes for providing a second current;

a third current source having an output providing a third current;

a sixth transistor having a collector coupled to said cathodes of said third and fourth diodes and to said output of said first current source, a base coupled for receiving said first control signal, and an emitter coupled to said output of said third current source; and a seventh transistor having a collector coupled to said output of said second current source and to said anodes of said first and second diodes, a base coupled for receiving an inverted first control signal, and an emitter coupled to said output of said third current source.

* * * * *